(12) United States Patent
Morooka

(10) Patent No.: US 9,263,593 B2
(45) Date of Patent: Feb. 16, 2016

(54) SEMICONDUCTOR DEVICE

(71) Applicant: KABUSHIKI KAISHA TOSHIBA, Minato-ku, Tokyo (JP)

(72) Inventor: Tetsu Morooka, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 42 days.

(21) Appl. No.: 14/104,929

(22) Filed: Dec. 12, 2013

(65) Prior Publication Data

US 2015/0041799 A1 Feb. 12, 2015

(30) Foreign Application Priority Data

Aug. 9, 2013 (JP) .................................. 2013-165884

(51) Int. Cl.
*H01L 29/10* (2006.01)
*H01L 29/786* (2006.01)
*H01L 27/12* (2006.01)

(52) U.S. Cl.
CPC .......... *H01L 29/7869* (2013.01); *H01L 27/124* (2013.01); *H01L 27/1225* (2013.01)

(58) Field of Classification Search
CPC ........................ H01L 21/02521; H01L 29/247
USPC ....................................... 257/43, 63; 438/478
See application file for complete search history.

(56) References Cited

U.S. PATENT DOCUMENTS

| 6,674,106 B2 * | 1/2004 | Tanaka et al. ................. 257/222 |
| 8,304,773 B2 | 11/2012 | Shimada |
| 2001/0053463 A1 * | 12/2001 | Thompson et al. ........... 428/690 |
| 2006/0014368 A1 * | 1/2006 | Peng et al. ..................... 438/604 |
| 2010/0109003 A1 * | 5/2010 | Akimoto et al. ................. 257/43 |
| 2010/0117078 A1 * | 5/2010 | Kuwabara et al. .............. 257/43 |
| 2011/0062432 A1 | 3/2011 | Yamazaki et al. |
| 2012/0298986 A1 | 11/2012 | Inoue et al. |
| 2013/0075740 A1 * | 3/2013 | Correia Fortunato et al. .. 257/63 |

FOREIGN PATENT DOCUMENTS

| JP | 07-131019 A | 5/1995 |
| JP | 2009-141001 A | 6/2009 |
| JP | 2010-186967 A | 8/2010 |
| JP | 2011-086927 A | 4/2011 |
| JP | 2012-248582 A | 12/2012 |

* cited by examiner

*Primary Examiner* — Jami M Valentine
(74) *Attorney, Agent, or Firm* — Holtz, Holtz & Volek PC

(57) ABSTRACT

A semiconductor device according to an embodiment, includes a first dielectric film arranged above a gate electrode, an oxide semiconductor film arranged above the first dielectric film, a second dielectric film arranged above the oxide semiconductor film, a drain electrode having a drain contact portion that is arranged in the second dielectric film and connects one end side of the oxide semiconductor film to a wire of an upper layer, and a source electrode having a source contact portion that is arranged in the second dielectric film and connects another end side of the oxide semiconductor film to a wire of an upper layer. A wiring portion arranged above the second dielectric film and forming the wire of the upper layer is formed to overhang toward a center direction of the oxide semiconductor film on a source electrode side more than on a drain electrode side.

19 Claims, 10 Drawing Sheets

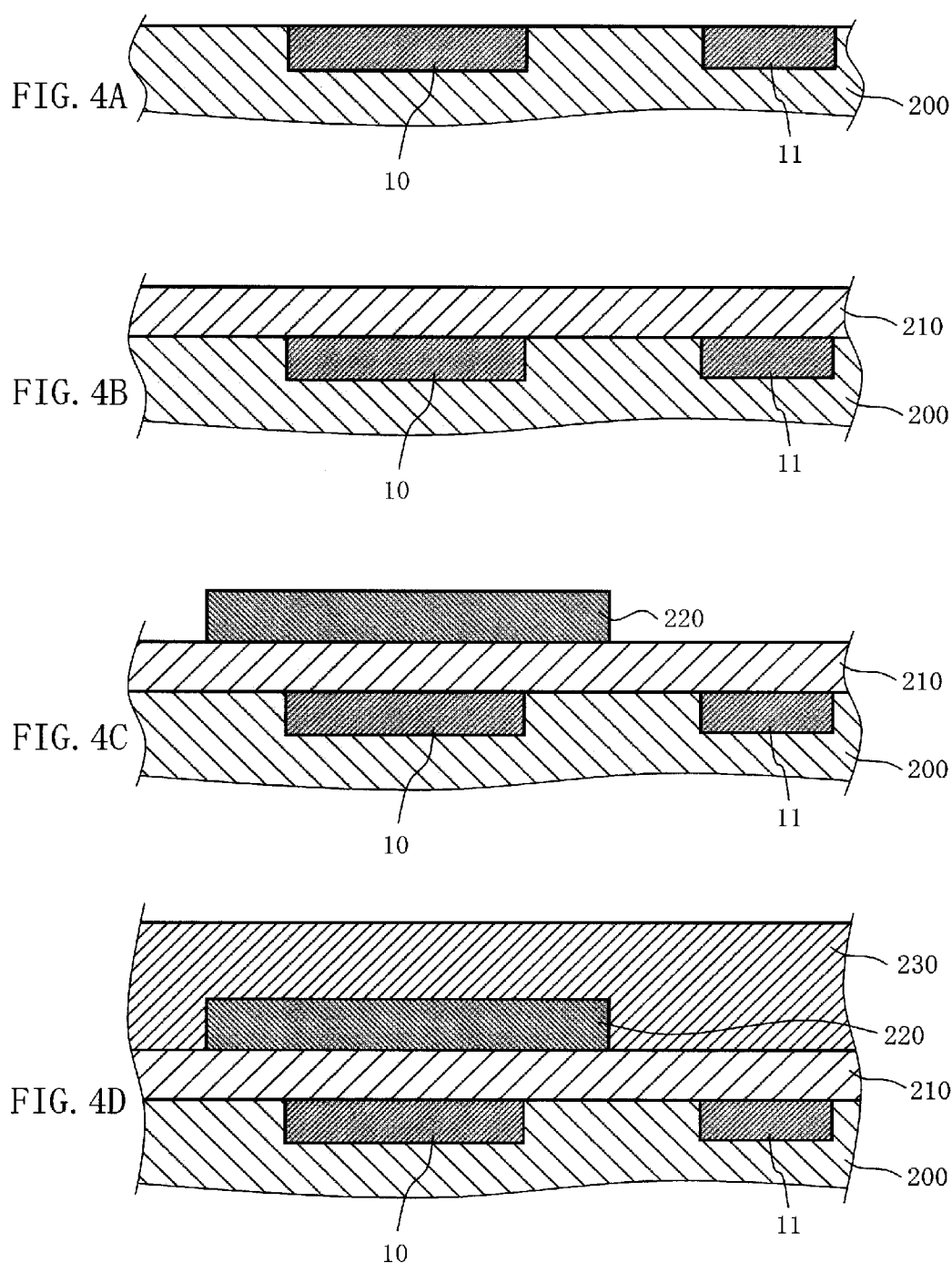

US 9,263,593 B2

SEMICONDUCTOR DEVICE

CROSS-REFERENCE TO RELATED APPLICATION

This application is based upon and claims the benefit of priority from Japanese Patent Application No. 2013-165884 filed on Aug. 9, 2013 in Japan, the entire contents of which are incorporated herein by reference.

FIELD

Embodiments described herein relate generally to a semiconductor device.

BACKGROUND

In recent years, thin-film transistors (TFT) using an oxide semiconductor film of InGaZnO as an oxide of indium (In), gallium (Ga), and zinc (Zn) or the like have been developed. The InGaZnO thin-film transistor can be fabricated easily even at low temperature and the mobility thereof is known to be high at 10 $cm^2$/Vs or more. Thus, the realization of BEOL (back end of line) transistors embedded in multilayer interconnection is expected. In addition, the application thereof to the next-generation liquid crystal panels is expected.

In contrast to silicon (Si)-MOSFET (metal oxide semiconductor field-effect transistor) and Si-TFT, InGaZnO-TFT is known to have a channel region as an accumulation layer, instead of an inversion layer. If the channel length becomes shorter with increasingly finer patterns, a current path is formed not only in the channel region near an interface on a gate dielectric film side of an InGaZnO film, but also near the interface with a dielectric film on a rear surface side of the InGaZnO film away from the gate dielectric film, posing a problem that a rear surface current flows. Such a problem is caused particularly when the InGaZnO-TFT is operated near a threshold voltage where the gate electric field is small. It is difficult to control a current flowing on the rear surface of the InGaZnO film by the gate electrode. As a result, problems such as degradation of sub-threshold swing S (Sfactor), an increase of off current, and degradation of 1/f noise characteristics are caused.

BRIEF DESCRIPTION OF THE DRAWINGS

FIGS. 4A to 4D are process sectional views of the method for fabricating a semiconductor device according to the first embodiment;

DETAILED DESCRIPTION

A semiconductor device according to an embodiment, includes a gate electrode, a first dielectric film, an oxide semiconductor film, a second dielectric film, a drain electrode, and a source electrode. The first dielectric film is arranged above the gate electrode. The oxide semiconductor film is arranged above the first dielectric film. The second dielectric film is arranged above the oxide semiconductor film. The drain electrode has a drain contact portion that is arranged in the second dielectric film and connects one end side of the oxide semiconductor film to a wire of an upper layer. The source electrode has a source contact portion that is arranged in the second dielectric film and connects another end side of the oxide semiconductor film to a wire of an upper layer. A wiring portion arranged above the second dielectric film and forming the wire of the upper layer is formed to overhang toward a center direction of the oxide semiconductor film on a source electrode side more than on a drain electrode side.

The embodiments below describe semiconductor devices capable of inhibiting a rear surface current flowing on a surface on the opposite side of a gate dielectric film side of an oxide semiconductor film.

First Embodiment

The first embodiment will be described below using drawings.

Figure 1:
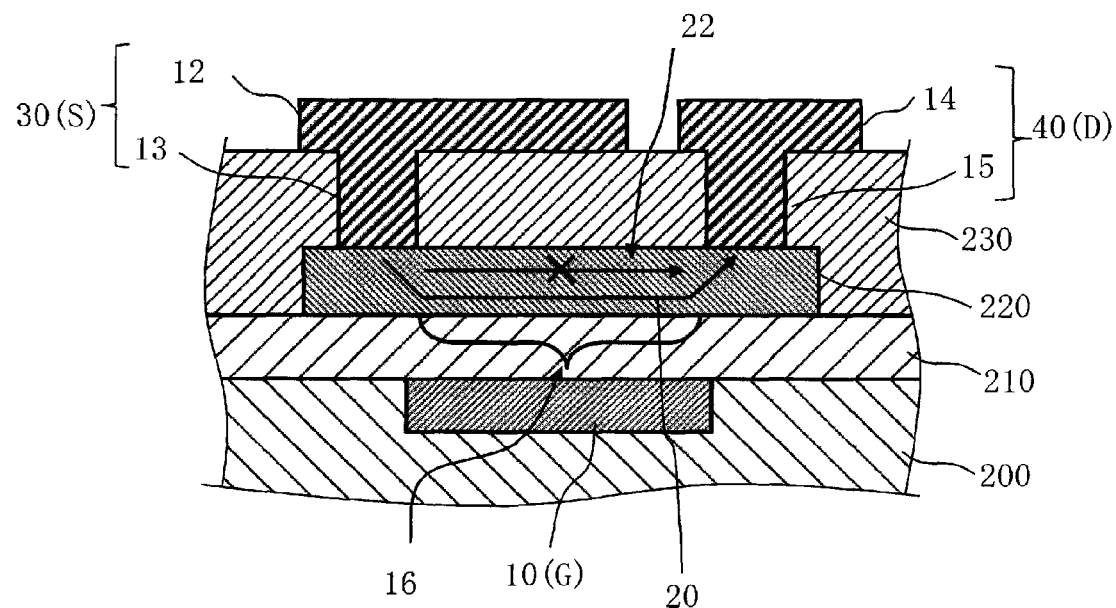
FIG. 1 is a sectional view showing a configuration of a semiconductor device according to a first embodiment.

FIG. 1 is a sectional view showing the configuration of a semiconductor device according to the first embodiment. In FIG. 1, an example of bottom gate type TFT using an oxide semiconductor film such as an InGaZnO film (IGZO film) is shown as a semiconductor device. In FIG. 1, a gate electrode 10 is formed on a substrate 200. In the example of FIG. 1, the gate electrode 10 is embedded such that the top surface (upper surface) of the gate electrode 10 is formed in the same height position as the top surface of the substrate 200. In the example of FIG. 1, for example, a case when the gate electrode 10 is formed in the same layer as a predetermined wire of a multilayer interconnection layer is assumed. Thus, other wiring layers or semiconductor elements may be formed in the substrate 200. However, the present embodiment is not limited to such a configuration and the gate electrode 10 may be formed on the substrate 200.

A gate dielectric film 210 (first dielectric film) is formed on the gate electrode 10. The gate dielectric film 210 is formed on the gate electrode 10 and the substrate 200. An oxide semiconductor film 220 is arranged on the gate dielectric film 210. As the oxide semiconductor film 220, for example, an InGaZnO film can suitably be used. In addition to the InGaZnO film, an InZnO film, ZnO film, ZnAlO film, ZnCuO film, NiO film, SnO film, CuO film, or InO film can be used. The oxide semiconductor film 220 is suitably formed in a width larger than the width in the gate length direction of, for example, the gate electrode 10.

A dielectric film 230 (second dielectric film) is formed on the oxide semiconductor film 220. The dielectric film 230 is arranged also on the gate dielectric film 210 to cover the oxide semiconductor film 220. A drain wiring portion 14 is arranged on the dielectric film 230. In addition, a drain contact portion 15 that connects the drain wiring portion 14 and one end side of the oxide semiconductor film 220 is arranged inside the dielectric film 230. The drain contact portion 15 is connected to the oxide semiconductor film 220 in a position where at least a portion of the drain contact portion 15 overlaps with one end in the gate length direction of the gate electrode 10. The drain wiring portion 14 and the drain contact portion 15 constitute a drain electrode 40.

Also, a source wiring portion 12 is arranged on the dielectric film 230. In addition, a source contact portion 13 that connects the source wiring portion 12 and the other end side of the oxide semiconductor film 220 is arranged inside the dielectric film 230. The source contact portion 13 is connected to the oxide semiconductor film 220 in a position where at least a portion of the source contact portion 13 overlaps with the another end in the gate length direction of the gate electrode 10. The source wiring portion 12 and the source contact portion 13 constitute a source electrode 30.

By adopting such a configuration, a region between the source contact portion 13 and the drain contact portion 15 in the oxide semiconductor film 220 becomes a channel region 16 where a current flows. In TFT using an InGaZnO film, as described above, the channel region is known to be an accumulation layer, instead of an inversion layer. If the channel length becomes shorter with increasingly finer patterns, a current path is formed not only in the channel region near an interface on a gate dielectric film side of the InGaZnO film, but also near the interface with a dielectric film on a rear surface side of the InGaZnO film away from the gate dielectric film, posing a problem that a rear surface current flows. Such a problem is more conspicuously caused when the gate length becomes narrower up to 1 μm or less. Thus, in the first embodiment, the source wiring portion 12 and the drain wiring portion 14 are formed asymmetrically. More specifically, a structure in which the source wiring portion 12 extends to the side of the drain wiring portion 14 is adopted.

Figure 2:
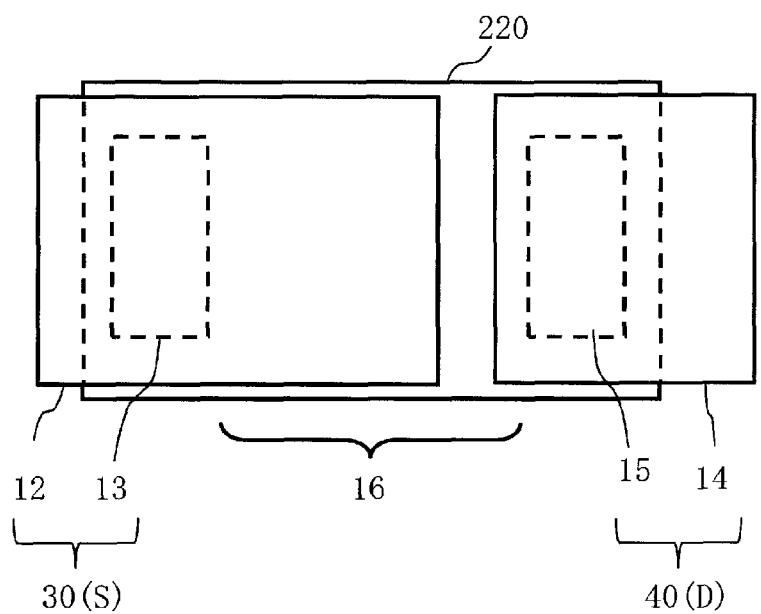
FIG. 2 is a top view showing a portion of the semiconductor device according to the first embodiment.

FIG. 2 is a top view showing a portion of the semiconductor device according to the first embodiment. As shown in FIG. 2, the source wiring portion 12 is arranged on the dielectric film 230 so as to overhang to the side of the channel region 16 of the oxide semiconductor film 220 than the drain wiring portion 14. The source electrode 30 and the drain electrode 40 need to be in a non-contact state. The width of a gap between the source wiring portion 12 and the drain wiring portion 14 may be a process limit width. The width may suitably be set to, for example, 0.05 to 0.2 μm. It is suitable to form the source wiring portion 12 in a width of 50% of the channel length or more to cover the channel region 16 of the oxide semiconductor film 220. Preferably, the source wiring portion 12 is formed to cover 70% or more. More preferably, the source wiring portion 12 is formed to cover 95% or more. By adopting such a configuration, the source wiring portion 12 can cover the rear surface (surface on the opposite side of the gate electrode 10 side) of the oxide semiconductor film 220 through the dielectric film 230.

In the case of the structure shown in FIG. 1, a region near the surface on the gate electrode 10 side of the oxide semiconductor film 220 is changed to the channel region 16 by applying a gate voltage (gate-source voltage) to the gate electrode 10 and if a drain-source voltage is applied, carriers 20 move from the source electrode 30 to the drain electrode 40 and a current flows between the source electrode 30 to the drain electrode 40. On the other hand, according to the structure shown in FIG. 1, the source wiring portion 12 overhanging to the center direction side of the oxide semiconductor film 220 serves as a back gate and a back gate potential becomes a source potential and thus, a rear surface channel of the oxide semiconductor film 220 is less likely to be turned on so that a rear surface current due to movement of carriers 22 on the rear surface side can be inhibited. Therefore, an off leak current can be reduced, Sfactor can be improved, and 1/f noise can be improved. In addition, a substrate floating effect of channel by the gate electrode 10 under the influence of the source potential can be improved so that improvement of the threshold voltage can be achieved.

Figure 3:
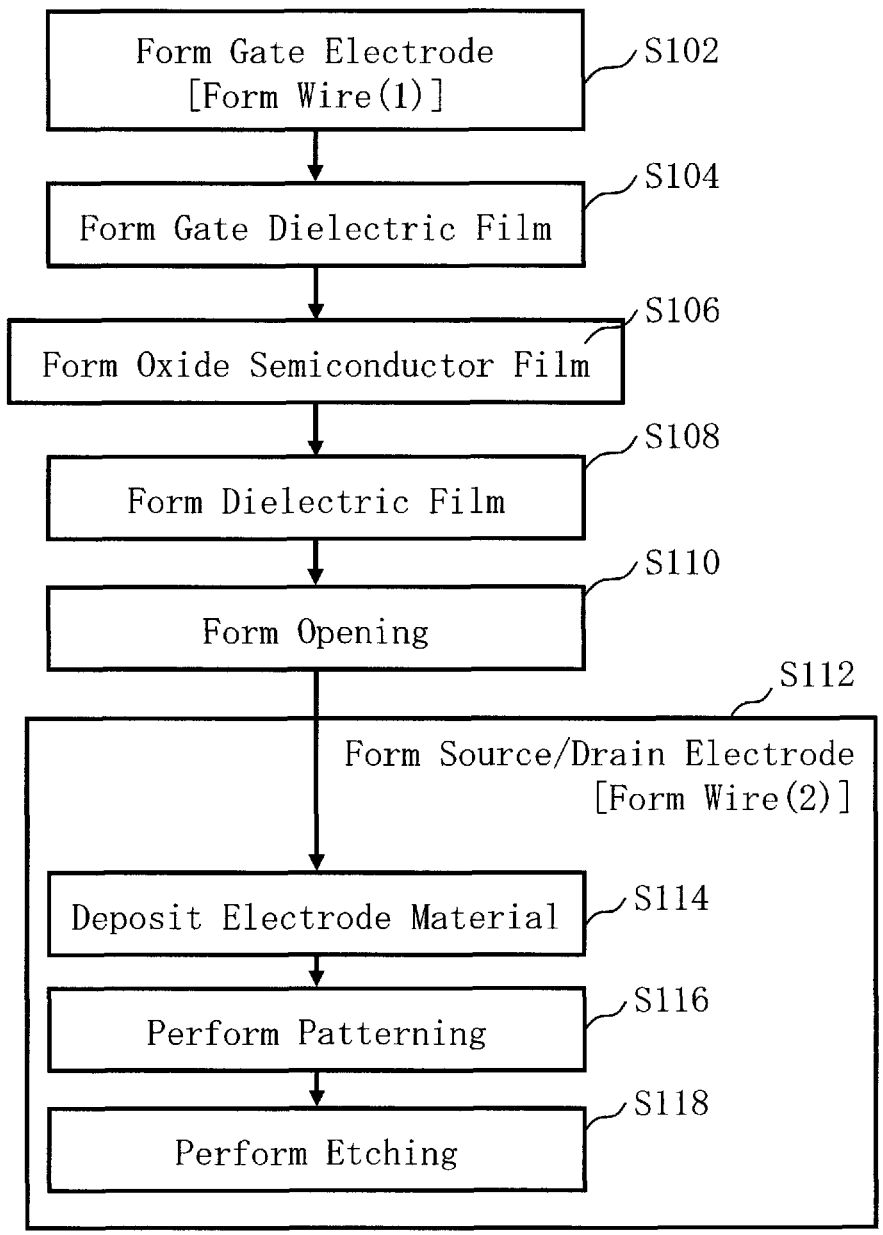
FIG. 3 is a flow chart showing principal processes of a method for fabricating a semiconductor device according to the first embodiment.

FIG. 3 is a flow chart showing principal processes of a method for fabricating a semiconductor device according to the first embodiment. In FIG. 3, the method for fabricating a semiconductor device according to the first embodiment executes a series of processes including a gate electrode formation process (S102), a gate dielectric film formation process (S104), an oxide semiconductor film formation process (S106), a dielectric film formation process (S108), an opening formation process (S110), and a source/drain electrode formation process (S112). In the source/drain electrode formation process (S112), an electrode material deposition process (S114), a patterning process (S116), and an etching process (S118) are executed as its internal processes.

FIGS. 4A to 4D show process sectional views of the method for fabricating a semiconductor device according to the first embodiment. FIGS. 4A to 4D show the gate electrode formation process (S102) to the dielectric film formation process (S108) in FIG. 3. Subsequent processes will be described later.

In FIG. 4A, as the gate electrode formation process (S102), the gate electrode 10 is formed on the substrate 200. It is assumed here that TFT using an oxide semiconductor film is created in a multilayer interconnection layer and a portion of metal wires of multilayer interconnection is present by the transistor. In FIG. 4A, one wire 11 (wire (1)) of the multilayer interconnection is formed at the same time in the same layer as the gate electrode 10. In the example of FIG. 4A, the gate electrode 10 and the wire 11 are embedded in the dielectric film by a damascene process. For example, an opening (groove) for the gate electrode 10 and an opening (groove) for the wire 11 are formed in the substrate 200. Then, a gate electrode material is deposited on the substrate 200 to bury each opening. After the deposition, the excessive gate electrode material protruding from each opening may be removed by polishing using the chemical-mechanical polishing (CMP) method. The wire 11 (first wire) is formed by the above process on a side face side of the gate electrode 10. The wire 11 constitutes a portion of the multilayer interconnection. As the material of the gate electrode 10 and the wire 11, for example, copper (Cu), tantalum (Ta), tantalum nitride (TaN), titanium nitride (TiN), molybdenum (Mo) or the like can be used. When Cu is used, a barrier metal film may be formed on the side face and the bottom of the openings before burying the openings via the barrier metal film to prevent diffusion of Cu to the substrate 200 or the like. As the substrate 200, for example, a silicon substrate made of a silicon wafer of 300 mm in diameter on which a dielectric film in which the gate electrode material is embedded is used. Though not illustrated, wires or various elements may be formed on the substrate 200.

The example of FIG. 4A shows an embedded structure by a damascene process, but for materials other than Cu for which it is difficult to perform etching, the method is not limited to the above example and the gate electrode 10 and the wire 11 may be formed by depositing a gate electrode material on the substrate 200 by a sputter process or the like and then patterning the material by an etching method.

In FIG. 4B, as the gate dielectric film formation process (S104), the gate dielectric film 210 is formed on the gate electrode 10 and the wire 11 to a thickness of, for example, 5 to 50 nm using the chemical vapor deposition (CVD) method. Here, the gate dielectric film 210 is formed to a thickness of, for example, 15 nm. As the material of the gate dielectric film 210, for example, silicon oxide ($SiO_2$), silicon nitride (SiN), silicon oxynitride (SiON) or the like can suitably be used. As the formation method, the plasma CVD method or the atomic layer deposition (ALD) or atomic layer chemical vapor deposition (ALCVD) can suitably be used. On the wire 11 side, the gate dielectric film 210 becomes a portion of interlayer dielectric between the wire 11 and an upper wire of the wire 11.

In FIG. 4C, as the oxide semiconductor film formation process (S106), the oxide semiconductor film 220 is formed on the gate dielectric film 210 to a thickness of, for example, 10 to 30 nm using the sputter process. Here, the oxide semiconductor film 220 is formed to a thickness of, for example, 30 nm. Then, the oxide semiconductor film 220 of a predetermined size is formed by patterning the oxide semiconductor film 220 like leaving an active region by the etching method. The oxide semiconductor film 220 may be formed in a width wider than the gate electrode 10. As the material of the oxide semiconductor film 220, as described above, an InGaZnO film, InZnO film, ZnO film, ZnAlO film, ZnCuO film, NiO film, SnO film, CuO film, or InO film can be used.

In FIG. 4D, as the dielectric film formation process (S108), the dielectric film 230 is formed on the oxide semiconductor film 220 and the gate dielectric film 210 to a thickness of, for example, 100 to 200 nm using the CVD method. Here, the dielectric film 230 is formed on the gate dielectric film 210 to a thickness of, for example, 150 nm. As the material of the dielectric film 230, for example, $SiO_2$, SiN, or SiON is suitably used. As the formation method, the plasma CVD method or the atomic layer deposition (ALD) or atomic layer chemical vapor deposition (ALCVD) can suitably be used. The dielectric film 230 is formed to cover the oxide semiconductor film 220 and becomes a protective film of the oxide semiconductor film 220. The dielectric film 230 becomes a portion of interlayer dielectric between the wire 11 in the multilayer interconnection and the upper wire of the wire 11.

Figure 5A:
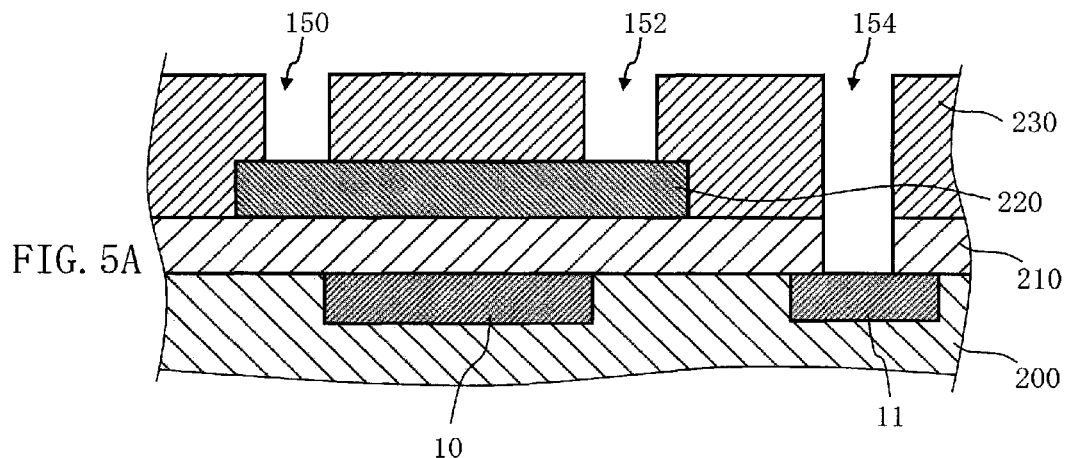
FIGS. 5A to 5C are process sectional views of the method for fabricating a semiconductor device according to the first embodiment.
Figure 5B:
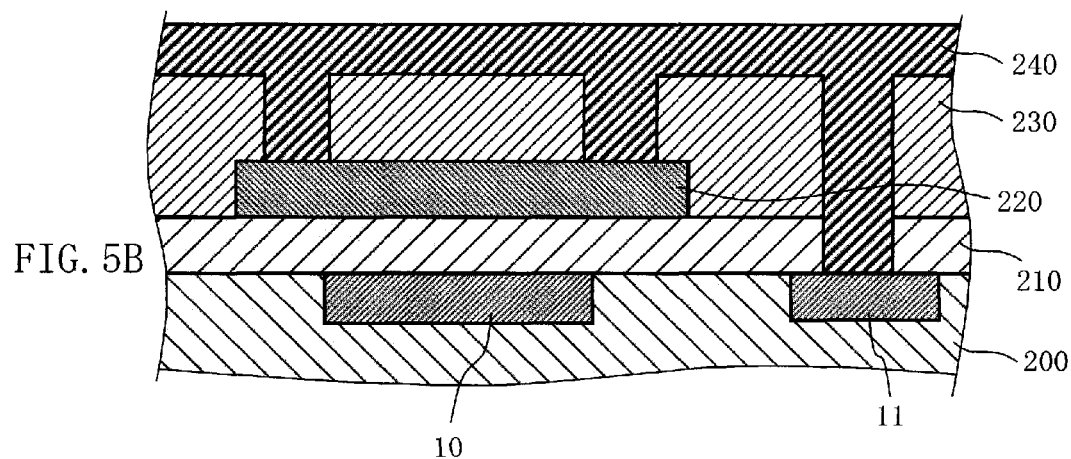
Figure 5C:
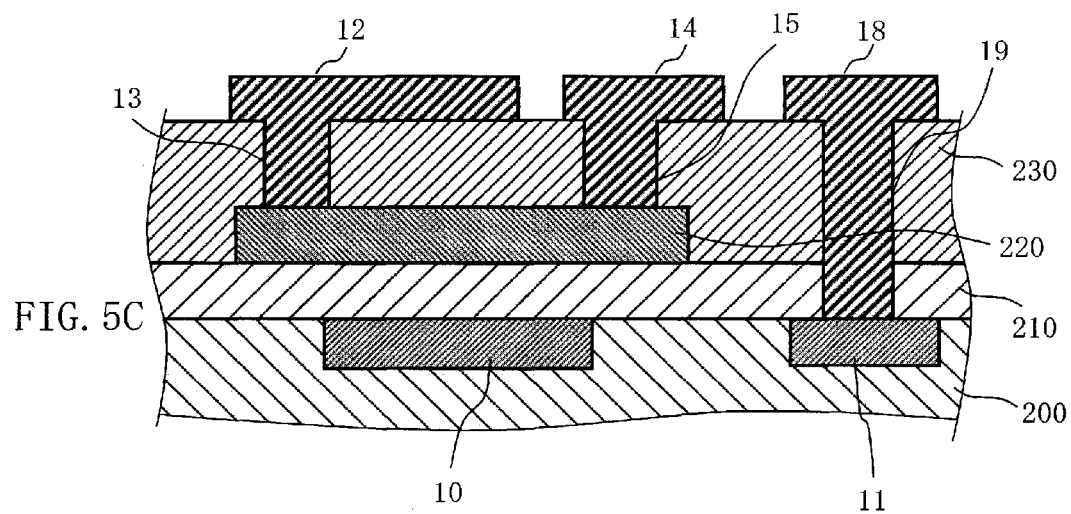

FIGS. 5A to 5C show process sectional views of the method for fabricating a semiconductor device according to the first embodiment. FIGS. 5A to 5C show the opening formation process (S110) and the source/drain electrode formation process (S112) in FIG. 3.

In FIG. 5A, as the opening formation process (S110), openings 150, 152, 154 are formed so as to pass through the dielectric film 230 from the surface of the dielectric film 230 to the surface of the oxide semiconductor film 220 on the TFT side and so as to pass through the dielectric film 230 and the gate dielectric film 210 from the surface of the dielectric film 230 to the surface of the wire 11 on the multilayer interconnection side. On the TFT side, the opening 150 (contact hole) for the source is formed in a position where at least a portion of the source overlaps with one end in the gate length direction of the gate electrode 10. At the same time, the opening 152 (contact hole) for the drain is formed in a position where at least a portion of the drain overlaps with another end in the gate length direction of the gate electrode 10. On the multilayer interconnection side, the opening 154 (contact hole) is formed on the wire 11. The openings 150, 152, 154 are formed in a size of, for example, 1 µm or less in width. The openings 150, 152, 154 can be formed substantially perpendicularly to the surface of the substrate 200 by removing the exposed dielectric film 230 and gate dielectric film 210 from the substrate 200 having a resist pattern formed on the dielectric film 230 through the lithography process such as a resist coating process and exposure process, which are not shown, by the anisotropic etching method. As an example, the openings 150, 152, 154 may be formed by, for example, the reactive ion etching (RIE) method.

Then, as the source/drain electrode formation process (S112), the source wiring portion 12, the source contact portion 13, the drain wiring portion 14, the drain contact portion 15, a wire 18 (wire (2)), and a via contact 19 are formed at the same time. The concrete formation thereof is as follows.

In FIG. 5B, as the electrode material deposition process (S114), an electrode material 240 is deposited on the dielectric film 230 to a thickness of, for example, 200 to 400 nm so as to completely bury the openings 150, 152, 154 using the sputter process. Here, the electrode material is deposited to a thickness of, for example, 300 nm. As the electrode material 240, for example, a metal such as Mo, TaN, TiN, or ruthenium (Ru) can be used. Alternatively, a plurality of metallic materials may be deposited. Further, in the first embodiment, as materials of the source electrode 30 (the source wiring portion 12 and the source contact portion 13), the drain electrode 40 (the drain wiring portion 14 and the drain contact portion 15), the wire 18 (wire (2)), and the via contact 19, materials having a work function higher than that of the material used for the gate electrode 10 are used. Particularly, as the material of the source electrode 30, a material having a work function higher than that of the material used for the gate electrode 10 is used. When, for example, Ta is used as the material of the gate electrode 10, TaN is suitably used as the metallic material of the source electrode 30 and the like. By using a material of the source electrode 30 having a work function higher than that of the material used for the gate electrode 10, the threshold voltage on the rear surface (surface opposite to the gate electrode side) of the oxide semiconductor film 220 is increased and a current is less likely to flow on a rear surface channel so that a greater effect can be gained.

In FIG. 5C, as the patterning process (S116), a resist pattern is formed on the electrode material 240 through the lithography process such as a resist coating process and exposure process, which are not shown. Then, as the etching process (S118), the source wiring portion 12, the drain wiring portion 14, and the wire 18 (wire (2)) can be formed by removing the exposed electrode material 240 by the anisotropic etching method. As shown in FIG. 5C, the source electrode 30 (the source wiring portion 12 and the source contact portion 13), the drain electrode 40 (the drain wiring portion 14 and the drain contact portion 15), the wire 18 (wire (2)), and the via contact 19 can be formed by each of the above processes.

According to the first embodiment, as described above, a rear surface current flowing on a surface on the opposite side of the gate dielectric film 210 side of the oxide semiconductor film 220 can be inhibited. As a result, an off leak current can be reduced, Sfactor can be improved, and 1/f noise can be improved.

Second Embodiment

In the first embodiment, an example in which the height position of the wire 18 on the upper wire side in the multilayer interconnection formed on the side face side of TFT and the height position of the source wiring portion 12 or/and the drain wiring portion 14 of TFT are formed in the same position is described. In the first embodiment, the thickness of the dielectric film 230 formed on the oxide semiconductor film 220 is decided (limited) by the design thickness of an interlayer dielectric (laminated film of the gate dielectric film 210 and the dielectric film 230) between the wire 11 and the wire 18 on the lower wire side. In the second embodiment, a configuration in which the thickness of the dielectric film 230 is individually on the TFT side and the multilayer interconnection side will be described.

Figure 6:
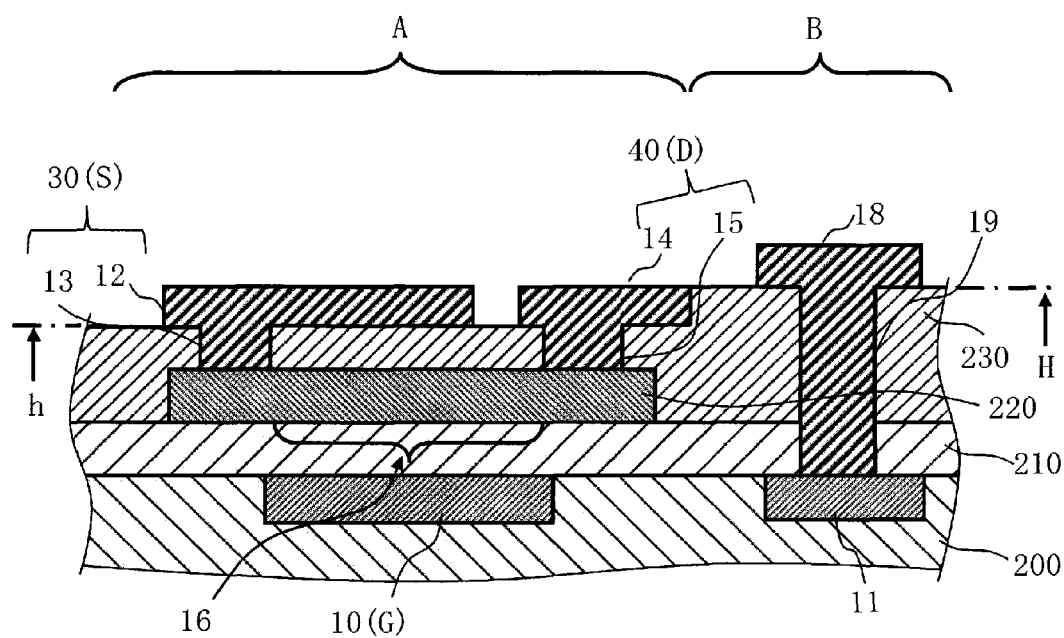
FIG. 6 is a sectional view showing the configuration of the semiconductor device according to a second embodiment.

FIG. 6 is a sectional view showing the configuration of the semiconductor device according to the second embodiment. The semiconductor device shown in FIG. 6 is similar to FIG. 5C in which a multilayer interconnection portion is added to the content in FIG. 1 except that the height position of the top surface of the dielectric film 230 is different between a TFT region A and a multilayer interconnection region B. In addition, content other than the content described below is the same as in the first embodiment.

In the multilayer interconnection region B of FIG. 6, the wire 11 (first wire) constituting a portion (lower wire side) of the multilayer interconnection, the wire 18 (second wire) constituting another portion (upper wire side) of the multilayer interconnection, and the via contact 19 connecting the wires 11, 18 are shown. Like the first embodiment, the gate dielectric film 210 and the dielectric film 230 used on the TFT side are used as an interlayer dielectric between the wires 11 and 18. In the example of FIG. 6, the interlayer dielectric between the wires 11 and 18 is formed of the laminated film of the gate dielectric film 210 and the dielectric film 230, but the present embodiment is not limited to such an example. A dielectric film (not shown) may further be stacked.

In the second embodiment, as shown in FIG. 6, the height position of the top surface (height position h) of the dielectric film 230 between a portion (the source wiring portion 12) overhanging to the channel region 16 side of the source electrode 30 and the oxide semiconductor film 220 is formed so as to be lower than height position of the top surface (height position H) of the interlayer dielectric between the wires 11 and 18. In other words, in the second embodiment, the thickness of a rear surface protective film (the dielectric film 230) below the source electrode 30 is made thinner. If the rear surface protective film (the dielectric film 230) in the TFT region A is regarded as a rear surface gate dielectric film, the influence of the source electrode 30 on a rear surface channel can be increased by making the thickness thereof thinner. More specifically, because the threshold voltage of the rear surface channel rises, a current is less likely to flow on the rear surface channel when compared with the first embodiment so that a greater effect can be gained.

Figure 7:
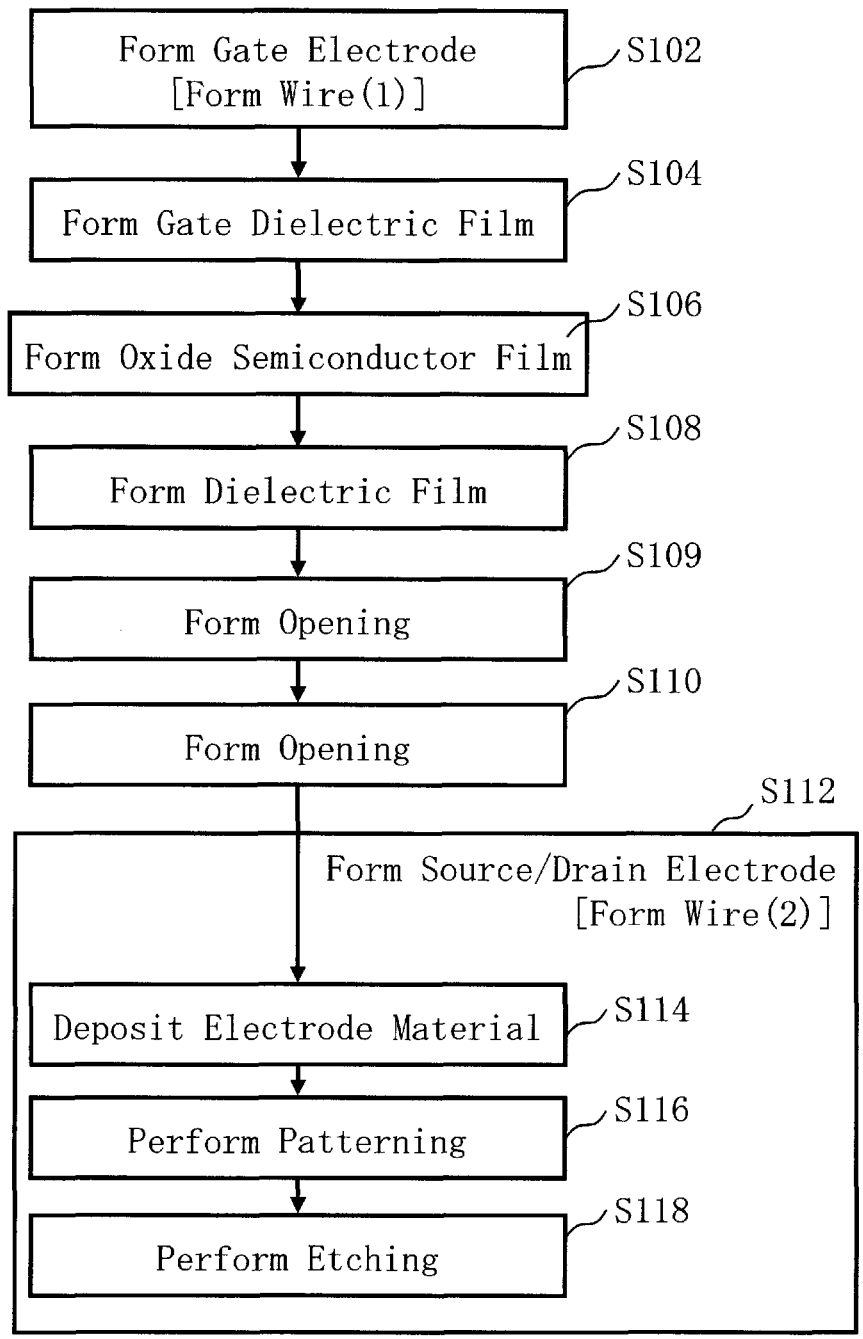
FIG. 7 is a flow chart showing principal processes of the method for fabricating a semiconductor device according to the second embodiment.

FIG. 7 is a flow chart showing principal processes of the method for fabricating a semiconductor device according to the second embodiment. FIG. 7 is the same as FIG. 3 except that an opening formation process (S109) is added to between the dielectric film formation process (S108) and the opening formation process (S110).

The content of each process from the gate electrode formation process (S102) to the dielectric film formation process (S108) is the same as in the first embodiment (FIGS. 4A to 4D).

FIGS. 8A to 8D show process sectional views of the method for fabricating a semiconductor device according to the second embodiment. FIGS. 8A to 8D show the opening formation process (S109) to the source/drain electrode formation process (S112) in FIG. 7.

Figure 8:
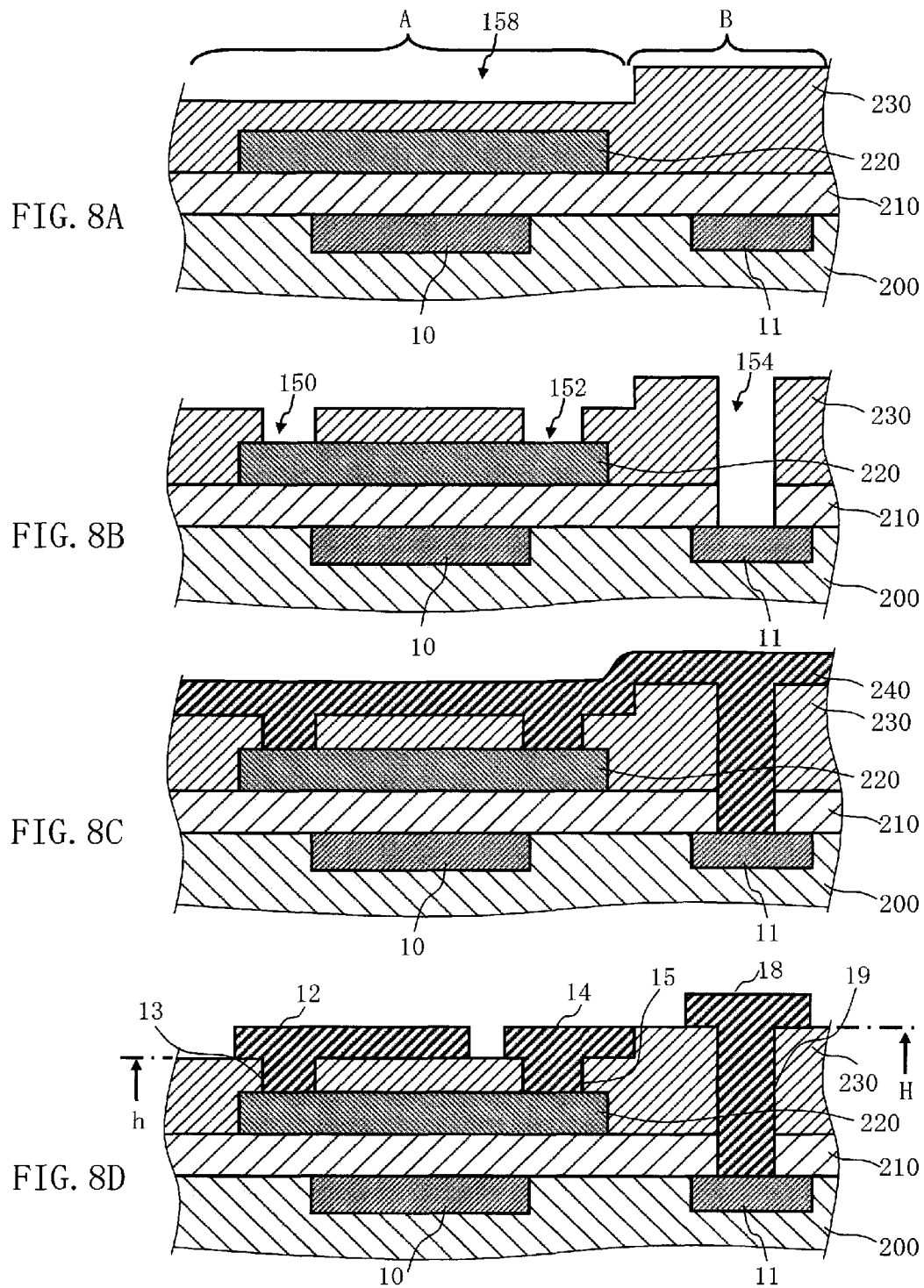
FIGS. 8A to 8D are process sectional views of the method for fabricating a semiconductor device according to the second embodiment.

In FIG. 8A, as the opening formation process (S109), the thickness of the dielectric film 230 is made thinner in the TFT region A than in the multilayer interconnection region B from the state of FIG. 4D. For example, the dielectric film 230 on the oxide semiconductor film 220 is processed to a thickness of 50 to 100 nm. Alternatively, the thickness may be thinned up to the thickness of the gate dielectric film 210. Here, an opening 158 whose width and length (x, y direction dimensions) are substantially adjusted to the TFT region A is formed to make the TFT region A thinner. The opening 158 can be formed substantially perpendicularly to the surface of the substrate 200 by removing the exposed dielectric film 230 from the substrate 200 having a resist pattern formed on the dielectric film 230 of the multilayer interconnection region B through the lithography process such as a resist coating process and exposure process, which are not shown, by the anisotropic etching method. As an example, the opening 158 may be formed by, for example, the reactive ion etching (RIE) method.

In FIG. 8B, as the opening formation process (S110), the openings 150, 152 are formed so as to pass through the dielectric film 230 from the surface of the dielectric film 230 where the surface height is one step below the multilayer interconnection region B to the surface of the oxide semiconductor film 220 in the TFT region A. In the multilayer interconnection region B, the opening 154 is formed so as to pass through the dielectric film 230 and the gate dielectric film 210 from the surface of the dielectric film 230 where the surface height is one step above the TFT region A to the surface of the wire 11.

In FIG. 8C, as the electrode material deposition process (S114), the electrode material 240 is deposited on the stepped dielectric film 230 to a thickness of, for example, 200 to 400 nm so as to completely bury the openings 150, 152, 154 using the sputter process. Here, the electrode material is deposited to a thickness of, for example, 300 nm.

In FIG. 8D, as the patterning process (S116), a resist pattern is formed on the electrode material 240 through the lithography process such as a resist coating process and exposure process, which are not shown. Then, as the etching process (S118), the source wiring portion 12, the drain wiring portion 14, and the wire 18 (wire (2)) can be formed by removing the exposed electrode material 240 by the anisotropic etching method. As shown in FIG. 8D (and FIG. 6), the source electrode 30 (the source wiring portion 12 and the source contact portion 13), the drain electrode 40 (the drain wiring portion 14 and the drain contact portion 15), the wire 18 (wire (2)), and the via contact 19 can be formed by each of the above processes while the rear surface protective film is made thinner.

According to the second embodiment, as described above, when compared with the first embodiment, the effect of inhibiting a rear surface current flowing on a surface on the opposite side of the gate dielectric film. 210 side of the oxide semiconductor film 220 can further be increased.

Third Embodiment

In the first and second embodiments, configurations in which the height position of the source wiring portion 12 overhanging in the center direction of the oxide semiconductor film 220 and the height position of the drain wiring portion 14 are the same are shown, but configurations thereof are not limited to such examples. In the third embodiment, a configuration in which the height position of the source wiring portion 12 overhanging in the center direction of the oxide semiconductor film 220 and the height position of the drain wiring portion 14 are different will be described.

Figure 9:
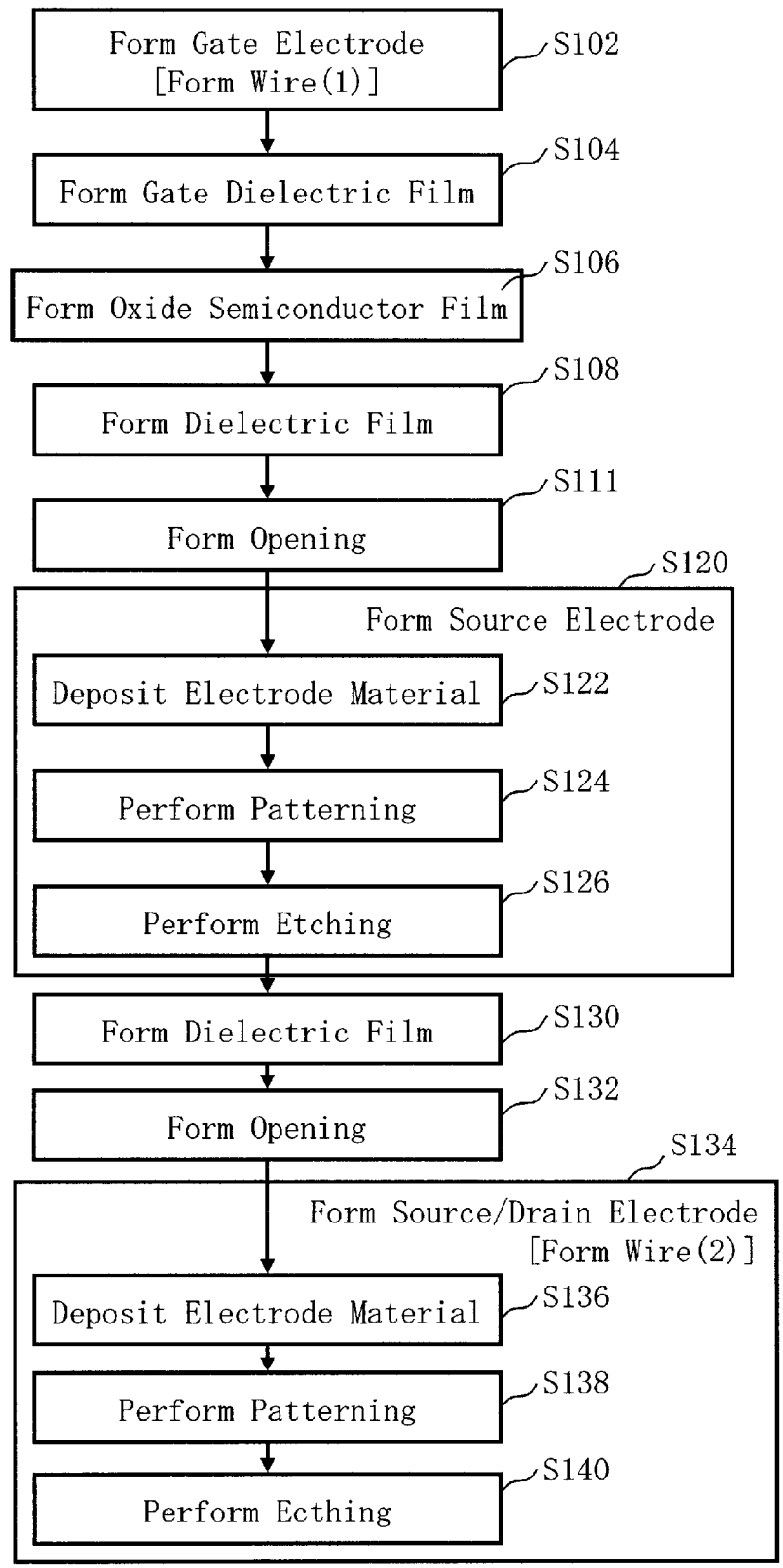
FIG. 9 is a flow chart showing principal processes of the method for fabricating a semiconductor device according to a third embodiment.

FIG. 9 is a flow chart showing principal processes of the method for fabricating a semiconductor device according to the third embodiment. FIG. 9 is the same as FIG. 3 except that after the dielectric film formation process (S108), instead of the opening formation process (S110) and the source/drain electrode formation process (S112), an opening formation process (S111), a source electrode formation process (S120), a dielectric film formation process (S130), an opening formation process (S132), and a source/drain electrode formation process (S134) are added. In the source electrode formation process (S120), an electrode material deposition process (S122), a patterning process (S124), and an etching process (S126) are executed as its internal processes. In the source/drain electrode formation process (S134), an electrode material deposition process (S136), a patterning process (S138), and an etching process (S140) are executed as its internal processes. In addition, content other than the content described below is the same as in the first embodiment.

The content of each process from the gate electrode formation process (S102) to the dielectric film formation process (S108) is the same as in the first embodiment. In the third embodiment, as will be described later, the thickness of the dielectric film 230 is suitably made thinner than in the first embodiment in the dielectric film formation process (S108) to stack still another dielectric film in an upper layer of the dielectric film 230. The dielectric film 230 is formed to a thickness of, for example, 50 to 100 nm. Alternatively, the thickness may be thinned up to the thickness of the gate dielectric film 210.

As the opening formation process (S111), an opening is formed so as to pass through the dielectric film 230 from the surface of the dielectric film 230 to the surface of the oxide semiconductor film 220 in a position where a source contact is formed on the TFT side from the state in FIG. 4D. In FIG. 5A, the opening 150 is formed without the openings 152, 154 in the third embodiment. The opening 150 (contact hole) for the source is formed in a position where at least a portion of the source overlaps with one end in the gate length direction of the gate electrode 10. The opening 150 is formed in a size of, for example, 1 μm or less in width. The opening 150 can be formed substantially perpendicularly to the surface of the substrate 200 by removing the exposed dielectric film 230 from the substrate 200 having a resist pattern formed on the dielectric film 230 through the lithography process such as a resist coating process and exposure process, which are not shown, by the anisotropic etching method. As an example, the opening 150 may be formed by, for example, the reactive ion etching (RIE) method. Other content is the same as in the first embodiment.

FIGS. 10A to 10D show process sectional views of the method for fabricating a semiconductor device according to the third embodiment. FIGS. 10A to 10D show the source electrode formation process (S120) to the source/drain electrode formation process (S134) in FIG. 9.

Figure 10:
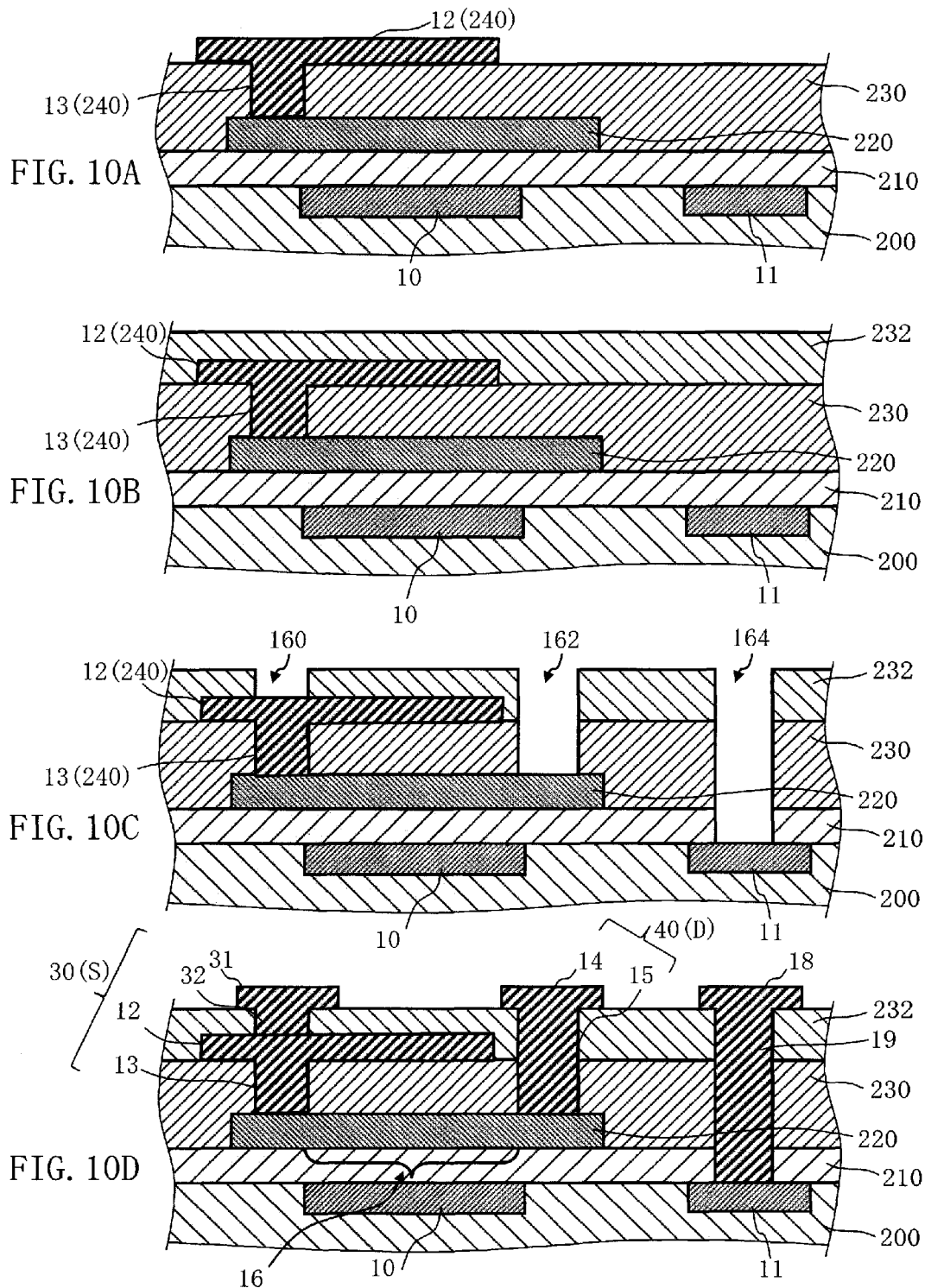
FIGS. 10A to 10D are process sectional views of the method for fabricating a semiconductor device according to the third embodiment.

In FIG. 10A, as the source electrode formation process (S120), the source wiring portion 12 (first source wiring portion) and the source contact portion 13 (first source contact portion) to be a portion of the source electrode 30 are formed at the same time. The concrete formation thereof is as follows.

As the electrode material deposition process (S122), the electrode material 240 is deposited on the dielectric film 230 to a thickness of, for example, 100 to 200 nm so as to completely bury the opening 150 using the sputter process. Here, the electrode material 240 is deposited on the dielectric film 230 to a thickness of 100 nm and is formed on, for example, the opening 150 so as to be 50 nm. As the electrode material 240, for example, a metal such as Mo, TaN, TiN, or Ru can be used. Alternatively, a plurality of metallic materials may be deposited. Further, like in the first embodiment, a material having a work function higher than that of the material used for the gate electrode 10 is used as a material for a portion (the source wiring portion 12 and the source contact portion 13) of the source electrode 30. When, for example, Ta is used as the material of the gate electrode 10, TaN is used as the metallic material of the source electrode 30 and the like. By using a material of the source electrode 30 having a work function higher than that of the material used for the gate electrode 10, the threshold voltage on the rear surface (surface opposite to the gate electrode side) of the oxide semiconductor film 220 is increased and a current is less likely to flow on a rear surface channel so that a greater effect can be gained.

As the patterning process (S124), a resist pattern is formed on the electrode material 240 through the lithography process such as a resist coating process and exposure process, which are not shown. Then, as the etching process (S126), the source wiring portion 12 can be formed by removing the exposed electrode material 240 by the anisotropic etching method. As shown in FIG. 10A, a portion (the source wiring portion 12 and the source contact portion 13) of the source electrode 30 can be formed by each of the above processes. In the third embodiment, a structure in which the source wiring portion 12 extends to the drain side is adopted. It is suitable to form the source wiring portion 12 in a width of 50% of the channel length or more to cover the channel region 16 of the oxide semiconductor film 220. Preferably, the source wiring portion 12 is formed to cover 70% or more. More preferably, the source wiring portion 12 is formed to cover 95% or more. By adopting such a configuration, the source wiring portion 12 can cover the rear surface (surface on the opposite side of the gate electrode 10 side) of the oxide semiconductor film 220 through the dielectric film 230.

In FIG. 10B, as the dielectric film formation process (S130), a dielectric film 232 (third dielectric film) is formed on the source wiring portion 12 and the dielectric film 230 to a thickness of, for example, 100 to 200 nm using the CVD method. Here, the dielectric film is deposited to a thickness of, for example, 100 nm. As the material of the dielectric film 232, for example, $SiO_2$, SiN, or SiON is suitably used. As the formation method, the plasma CVD method or the atomic layer deposition (ALD) or atomic layer chemical vapor deposition (ALCVD) can suitably be used. The dielectric film 232 is formed like covering the oxide semiconductor film 220 and becomes a protective film of the oxide semiconductor film 220. The dielectric film 232 becomes a portion of interlayer dielectric between the wire 11 in the multilayer interconnection and an upper wire of the wire 11.

In FIG. 10C, as the opening formation process (S132), an opening 160 (contact hole) is formed so as to pass through the dielectric film 232 from the surface of the dielectric film 232 to the surface of the source wiring portion 12 on the source side of TFT. At the same time, an opening 162 (contact hole) is formed so as to pass through the dielectric films 230, 232 from the surface of the dielectric film 232 to the surface of the oxide semiconductor film 220 on the source drain side. At the same time, an opening 164 (contact hole) is formed so as to pass through the dielectric films 230, 232 and the gate dielectric film 210 from the surface of the dielectric film 232 to the surface of the wire 11 on the wire side. The openings 160, 162, 164 are formed in a size of, for example, 1 μm or less in width. The openings 160, 162, 164 can be formed substantially perpendicularly to the surface of the substrate 200 by removing the exposed dielectric films 232, 230 and gate dielectric film 210 from the substrate 200 having a resist pattern formed on the dielectric film 232 through the lithography process such as a resist coating process and exposure process, which are not shown, by the anisotropic etching method. As an example, the openings 160, 162, 164 may be formed by, for example, the reactive ion etching (RIE) method.

Then, as the source/drain electrode formation process (S134), a source wiring portion 31 (second source wiring portion), a source contact portion 32 (second source contact portion), the drain wiring portion 14, the drain contact portion 15, the wire 18 (wire (2)), and the via contact 19 are formed at the same time. The concrete formation thereof is as follows.

In FIG. 10D, as the electrode material deposition process (S136), an electrode material is deposited on the dielectric film 232 to a thickness of, for example, 200 to 400 nm like completely burying the openings 160, 162, 164 using the sputter process. Here, the electrode material is deposited to a thickness of, for example, 300 nm. As the electrode material, for example, a metal such as Mo, TaN, TiN, or Ru can be used. Alternatively, a plurality of metallic materials may be deposited.

As the patterning process (S138), a resist pattern is formed on the electrode material through the lithography process such as a resist coating process and exposure process, which are not shown. Here, the source wiring portion 31 and the drain wiring portion 14 may be formed in a symmetrical shape. In other words, because the source wiring portion 12 in the first layer is formed, the source wiring portion 31 in the second layer may not be formed in a shape overhanging to the center direction of the oxide semiconductor film 220. However, the drain wiring portion 14 is suitably formed so as not to overlap with the source wiring portion 12 in the first layer. Then, as the etching process (S140), the source wiring portion 31, the drain wiring portion 14, and the wire 18 (wire (2)) can be formed by removing the exposed electrode material by the anisotropic etching method. As shown in FIG. 10D, the remaining portion (the source wiring portion 31 and the source contact portion 32) of the source electrode 30, the drain electrode 40 (the drain wiring portion 14 and the drain contact portion 15), the wire 18 (wire (2)), and the via contact 19 can be formed by each of the above processes.

According to the third embodiment, as described above, the thickness of the rear surface protective film (the dielectric film 230) on the oxide semiconductor film 220 can be decided by the thickness thereof during deposition. Therefore, when compared with the second embodiment, the thickness thereof can more easily be controlled to a desired thickness. In addition, there is no process to make the protective film thinner by etching like in the second embodiment and thus, there is no danger of etching damage. In the third embodiment, as shown in FIG. 10D, the upper wire to which the oxide semiconductor film 220 is connected via the contact has a two-layer structure only on the source electrode 30 side and the source wiring portion 12 in the first layer arranged on the dielectric film 230 extends in the direction of the drain electrode 40 to cover the channel region 16 of InGaZnO-TFT. The thickness of the protective film (the dielectric film 230) between the source wiring portion 12 in the first layer and the oxide semiconductor film 220 is made, like in the second embodiment, thinner than the thickness of the interlayer dielectric (laminated film of the dielectric films 232, 230 and the gate dielectric film 210) on the wiring portion side. The thickness may be thinned up to the thickness of the gate dielectric film 210 without causing any problem.

According to the structure shown in FIG. 10D, the source wiring portion 12 overhanging in the center direction of the oxide semiconductor film 220 serves as a back gate and a back gate potential becomes a source potential and thus, a rear surface channel of the oxide semiconductor film 220 is less likely to be turned on so that a rear surface current due to movement of the carriers 22 on the rear surface side can be inhibited. Therefore, an off leak current can be reduced, Sfactor can be improved, and 1/f noise can be improved. In addition, a substrate floating effect of channel by the gate electrode 10 under the influence of the source potential can be improved so that improvement of the threshold voltage can be achieved. Further, the height position of the top surface of the dielectric film 230 between a portion (the source wiring portion 12) overhanging to the channel region 16 side of the source electrode 30 and the oxide semiconductor film 220 is lower than the height position of the top surface of the interlayer dielectric (laminated film of the dielectric films 232, 230 and the gate dielectric film 210) between the wires 11 and 18. Thus, when compared with a case in which the source wiring portion 31 overhangs to the channel region 16 side on the dielectric film 232, the influence of the source electrode 30 on a rear surface channel can be increased. More specifically, because the threshold voltage of the rear surface channel rises, a current is less likely to flow on the rear surface channel when compared with the first embodiment so that a greater effect can be gained.

Fourth Embodiment

In each of the above embodiments, as shown in FIG. 2, the shape in which the source wiring portion 12 of the source electrode 30 overhangs in the center direction of the oxide semiconductor film 220 is adopted, but both ends of the oxide semiconductor film 220 in a direction perpendicular to the direction from the source electrode 30 toward the drain electrode 40 are not covered. If not covered, the flow of current on a rear surface channel can be inhibited. However, if such a configuration is adopted, there is a possibility that a channel is formed in both end side face portions on the rear surface side (surface on the opposite side of the gate dielectric film 210) of the oxide semiconductor film 220.

Figure 11:
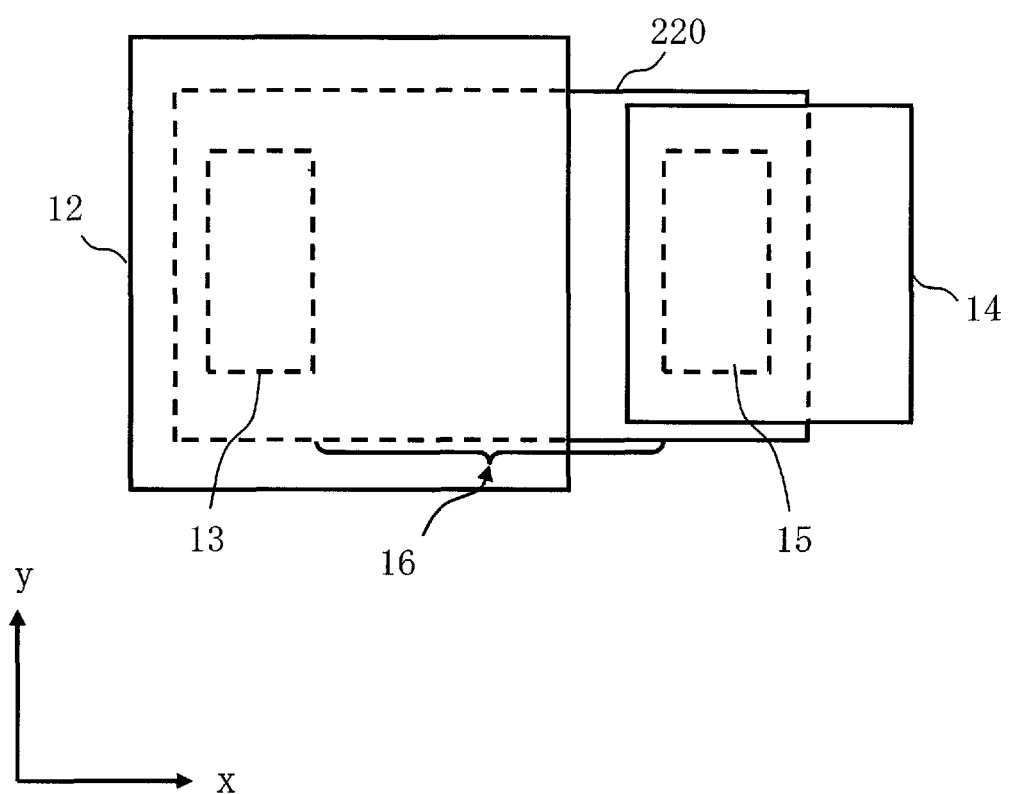
FIG. 11 is a top view showing a portion of the semiconductor device according to a fourth embodiment.

FIG. 11 is a top view showing a portion of the semiconductor device according to the fourth embodiment. As shown in FIG. 11, the source wiring portion 12 is arranged on the dielectric film 230 more overhanging in the center direction of the oxide semiconductor film 220 than the drain wiring portion 14. It is suitable to form the source wiring portion 12 in a width of 50% of the channel length or more like covering the channel region 16 of the oxide semiconductor film 220. Preferably, the source wiring portion 12 is formed to cover 70% or more. More preferably, the source wiring portion 12 is formed to cover 95% or more. Further, in the fourth embodiment, as shown in FIG. 11, the source wiring portion 12 covers both ends of the oxide semiconductor film 220 in a direction perpendicular to the direction from the source electrode 30 toward the drain electrode 40. By adopting such a structure, not only a current on a rear surface channel of the oxide semiconductor film 220, but also a current flowing from a side face channel of the oxide semiconductor film 220 can be inhibited and therefore, when compared with the first embodiment, a greater effect can be gained. Other content is the same as one of the first to third embodiments.

In the foregoing, the embodiments have been described with reference to concrete examples. However, the present disclosure is not limited to such concrete examples.

In addition, all semiconductor devices and all methods for fabricating a semiconductor device that include elements of the embodiments and whose design can be changed as appropriate by persons skilled in the art are included in the scope of the embodiments.

While techniques normally used in the semiconductor industry such as cleaning before and after treatment are not described for convenience of description, it is needless to say that such techniques are included in the scope of the present disclosure.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A semiconductor device comprising:
a gate electrode;
a first dielectric film arranged above the gate electrode;
an oxide semiconductor film arranged above the first dielectric film;
a second dielectric film arranged above the oxide semiconductor film;
a drain electrode having a drain contact portion that is arranged in the second dielectric film and that connects one end side of the oxide semiconductor film to a wire of an upper layer; and
a source electrode having a source contact portion that is arranged in the second dielectric film and connects another end side of the oxide semiconductor film to a wire of the upper layer,
wherein a wiring portion arranged above the second dielectric film and positioned in the upper layer is formed to overhang toward a center direction of the oxide semiconductor film more on a source electrode side than on a drain electrode side,
wherein the wiring portion includes a source wiring portion connected to the source contact portion, and a drain wiring portion connected to the drain contact portion, and
wherein the source wiring portion is arranged to overhang toward a channel region side of the oxide semiconductor film, wherein an overhang portion of the source wiring portion is arranged so as to face a channel region in the oxide semiconductor film via the second dielectric film.

2. The device according to claim 1, wherein a material used for the source electrode has a higher work function than a material used for the gate electrode.

3. The device according to claim 1, further comprising:
a first wire formed on a side face side of the gate electrode and constituting a portion of multilayer interconnection; and
a second wire arranged in an upper layer of the first wire and constituting another portion of the multilayer interconnection,
wherein at least the first and second dielectric films are used as an interlayer dielectric between the first and second wires, and
wherein a height position of a top surface of the second dielectric film between the wiring portion formed to overhang toward the center direction of the oxide semiconductor film and the oxide semiconductor film is lower than a height position of a top surface of the interlayer dielectric between the first and second wires.

4. The device according to claim 3, wherein a top surface of the gate electrode and a top surface of the first wire are formed so as to be in substantially a same height position.

5. The device according to claim 1, wherein the source wiring portion overhangs by over 50% of a channel length of the channel region in the oxide semiconductor film.

6. The device according to claim 1, wherein the source wiring portion overhangs by over 95% of a channel length of the channel region in the oxide semiconductor film.

7. The device according to claim 1, further comprising:
a first wire formed on a side face side of the gate electrode and constituting a portion of multilayer interconnection; and
a second wire arranged in an upper layer of the first wire and constituting another portion of the multilayer interconnection.

8. The device according to claim 7, wherein a top surface of the source wiring portion, a top surface of the drain wiring portion, and a top surface of the second wire are formed so as to be in substantially a same height position.

9. The device according to claim 7, wherein a top surface of the source wiring portion and a top surface of the drain wiring portion are formed so as to be in a lower height position than a top surface of the second wire.

10. The device according to claim 1, wherein the wiring portion formed to overhang toward the center direction of the oxide semiconductor film covers both ends of the oxide semiconductor film in a direction perpendicular to a direction from the source electrode toward the drain electrode, above the second dielectric film.

11. A semiconductor device comprising:
a gate electrode;
a first dielectric film arranged above the gate electrode;
an oxide semiconductor film arranged above the first dielectric film;
a second dielectric film arranged above the oxide semiconductor film;
a drain electrode including a drain wiring portion arranged above the second dielectric film and a drain contact portion arranged in the second dielectric film and connecting the drain wiring portion and the oxide semiconductor film; and
a source electrode including a source wiring portion arranged to overhang to a channel side of the oxide semiconductor film more than the drain wiring portion above the second dielectric film and a source contact portion arranged in the second dielectric film and connecting the source wiring portion and the oxide semiconductor film,
wherein an overhang portion of the source wiring portion is arranged so as to face a channel region in the oxide semiconductor film via the second dielectric film.

12. The device according to claim 11, further comprising:
a first wire formed on a side face side of the gate electrode and constituting a portion of multilayer interconnection; and
a second wire arranged in an upper layer of the first wire and constituting another portion of the multilayer interconnection.

13. The device according to claim 11, wherein a material used for the source wiring portion has a higher work function than a material used for the gate electrode.

14. The device according to claim 12, wherein at least the first and second dielectric films are used as an interlayer dielectric between the first and second wires, and
wherein a height position of a top surface of the second dielectric film between the source wiring portion overhanging to the channel side of the oxide semiconductor film and the oxide semiconductor film is lower than a height position of a top surface of the interlayer dielectric between the first and second wires.

15. The device according to claim 11, wherein the source wiring portion covers both ends of the oxide semiconductor film in a direction perpendicular to a direction from the source electrode toward the drain electrode and also covers an area larger than 50% of the channel region in the oxide semiconductor film above the second dielectric film.

16. The device according to claim 11, further comprising:
a third dielectric film arranged above the second dielectric film,
wherein the source wiring portion is arranged on the second dielectric film as a first source wiring portion, the drain wiring portion is arranged on the third dielectric film, and the source electrode further includes a second source wiring portion arranged on the third dielectric film, and a second source contact portion that connects the first source wiring portion and the second source wiring portion.

17. The device according to claim 16, wherein the first source wiring portion is formed to overhang to the channel side of the oxide semiconductor film more than the second source wiring portion.

18. The device according to claim 16, further comprising:
a first wire formed on a side face side of the gate electrode and constituting a portion of multilayer interconnection; and
a second wire arranged in an upper layer of the first wire and constituting another portion of the multilayer interconnection,
wherein the first, second, and third dielectric films are used as an interlayer dielectric between the first and second wires.

19. The device according to claim 11, wherein the source wiring portion overhangs by over 50% of a channel length of the channel region in the oxide semiconductor film.

* * * * *